(12) United States Patent
Savelli et al.

(10) Patent No.: US 9,528,502 B2
(45) Date of Patent: Dec. 27, 2016

(54) SYSTEM FOR CONVERSING THERMAL ENERGY INTO ELECTRICAL ENERGY

(75) Inventors: Guillaume Savelli, Grenoble (FR); Philippe Coronel, Barraux (FR); Stéphane Monfray, Eybens (FR); Thomas Skotnicki, Crolles-Monfort (FR)

(73) Assignees: Commissariat a l'energie atomique et aux energies alternatives, Paris (FR); STMICROELECTRONICS (CROLLES 2) SAS, Crolles (FR)

( * ) Notice: Subject to any disclaimer, the term of this patent is extended or adjusted under 35 U.S.C. 154(b) by 232 days.

(21) Appl. No.: 14/232,092

(22) PCT Filed: Jul. 9, 2012

(86) PCT No.: PCT/EP2012/063413
§ 371 (c)(1),
(2), (4) Date: Apr. 3, 2014

(87) PCT Pub. No.: WO2013/007693
PCT Pub. Date: Jan. 17, 2013

(65) Prior Publication Data
US 2015/0115769 A1    Apr. 30, 2015

(30) Foreign Application Priority Data

Jul. 11, 2011 (FR) .................................... 11 56280

(51) Int. Cl.
*H02N 2/00* (2006.01)
*H02N 10/00* (2006.01)
(Continued)

(52) U.S. Cl.
CPC ................. *F03G 7/06* (2013.01); *F03G 7/065* (2013.01); *H01L 41/1136* (2013.01); *H02N 2/18* (2013.01); *H02N 2/188* (2013.01)

(58) Field of Classification Search
CPC .............. H01L 35/20; G11B 5/55; H02K 7/18
(Continued)

(56) References Cited

U.S. PATENT DOCUMENTS

2008/0315725 A1* 12/2008 Konstanzer ............ F16F 7/1011
310/338
2009/0315335 A1* 12/2009 Ujihara ................... F03G 7/065
290/1 R
(Continued)

FOREIGN PATENT DOCUMENTS

EP    2 309 560        4/2011
JP    63-225130 A      9/1988
(Continued)

OTHER PUBLICATIONS

U.S. Appl. No. 14/369,752, filed Jun. 30, 2014, Dellea, et al.
(Continued)

*Primary Examiner* — Jose Gonzalez Quinones
(74) *Attorney, Agent, or Firm* — Oblon, McClelland, Maier & Neustadt, L.L.P.

(57) ABSTRACT

An assembly converting thermal energy into electrical energy including: at least one temperature sensitive bimetallic strip arranged in a space delimited by a hot source and a cold source facing each other, the bimetallic strip extending along a longitudinal axis; at least one suspended element fixed in movement to the sensitive element and extending laterally from the sensitive element and including a free end; and at least one piezoelectric element suspended from a part fixed relative to the sensitive element and vibrated by the suspended element such that it is vibrated when the bimetallic strip changes configuration and the suspended element comes into contact with the piezoelectric element, the piezo-
(Continued)

electric element being located outside the space defined between the bimetallic strip and the hot source and outside the space between the bimetallic strip and the cold source.

12 Claims, 2 Drawing Sheets

(51) Int. Cl.
   *H02N 1/08* (2006.01)
   *F03G 7/06* (2006.01)
   *H01L 41/113* (2006.01)
   *H02N 2/18* (2006.01)

(58) Field of Classification Search
   USPC .............................. 310/306, 307, 311, 309
   See application file for complete search history.

(56) References Cited

U.S. PATENT DOCUMENTS

2011/0083714 A1* 4/2011 Descure ............ H02N 2/18
                                                       136/239
2015/0001990 A1   1/2015 Ollier et al.

FOREIGN PATENT DOCUMENTS

| JP | 2000-244166 A | 9/2000 |
| JP | 2001-99051 A | 4/2001 |
| JP | 2006 158112 | 6/2006 |
| KR | 2011 0006884 | 1/2011 |

OTHER PUBLICATIONS

U.S. Appl. No. 14/375,858, filed Jul. 31, 2014, Dellea, et al.
U.S. Appl. No. 14/375,994, filed Jul. 31, 2014, Dellea, et al.
U.S. Appl. No. 14/375,532, filed Jul. 30, 2014, Dellea, et al.
U.S. Appl. No. 14/398,340, filed Oct. 31, 2014, Savelli, et al.
U.S. Appl. No. 14/423,957, filed Feb. 25, 2015, Dellea, et al.
U.S. Appl. No. 14/131,082, filed Jan. 6, 2014, Dellea, et al.
French Preliminary Search Report issued Feb. 27, 2012 in Patent Application No. FR 1156280 (with English translation of categories of cited documents).
Seok-Min Jung, et al., "A wideband energy harvesting device using snap-through buckling for mechanical frequency-up conversion", 23$^{rd}$ IEEE International Conference on Micro Electro Mechanical Systems (MEMS 2010), XP031655149, Jan. 24, 2010, pp. 1207-1210.
Werner Riethmueller, et al., "Thermally excited silicon microactuators", IEEE, Transactions on Electron Devices, vol. 35, No. 6, Jun. 1988, pp. 758-763.
Hal Jerman, "Electrically-activated, normally-closed diaphragm valves", J. Micromech. Microeng. 4, 1994, pp. 210-216 and Cover Page.
Jung, S. M., et al. "Energy-harvesting device with mechanical frequency-up conversion mechanism for increased power efficiency and wideband operation ", Applied Physics Letters, AIP, American Institute of Physics, Melville, NY, US, vol. 96, No. 11, pp. 111906-1, XP012130425, (2010).
Japanese Office Action issued Jun. 6, 2016 in Patent Application No. 2014-519519.
Jung, S. M., et al. "Energy-harvesting device with mechanical frequency-up conversion mechanism for increased power efficiency and wideband operation", Applied Physics Letters, AIP, American Institute of Physics, Melville, NY, US, vol. 96, No. 11, pp. 111906-1, XP012130425, (2010).
International Search Report Issued Oct. 12, 2012 in PCT/EP12/063413 Jul. 9, 2012.

* cited by examiner

SYSTEM FOR CONVERSING THERMAL ENERGY INTO ELECTRICAL ENERGY

TECHNICAL FIELD AND PRIOR ART

This invention relates to a system for conversing thermal energy into electrical energy.

Electronic circuits produce heat when they are in operation. This heat is not used and must be evacuated to avoid deteriorating circuits.

It is planned to recover this heat so that it can be converted into electrical energy.

There are devices for the conversion of mechanical energy into electrical energy for example using piezoelectric materials.

A piezoelectric material is a material that becomes electrically polarised when a mechanical deformation is applied to it, and generates an electrical voltage.

There are also structures providing very good deformability under the effect of temperature. For example, there are bimetallic strips. A bimetallic strip is formed from two flexible strips of different metals or alloys with different coefficients of expansion, welded or glued to each other along the direction of their length. Due to the different coefficients of expansion, the bimetallic strip deforms with a greater amplitude when it is heated and when it is cooled. When deformation occurs, the bimetallic strip becomes curved. The orientation of the curvature depends on the temperature applied to it.

PRESENTATION OF THE INVENTION

The purpose of this invention is to provide a system for conversing thermal energy into electrical energy with a simple structure and having a high recovery efficiency.

The above-mentioned purpose is achieved through the use of a system comprising an element with a shape that varies between two configurations as a function of the temperature applied to it, for example a bimetallic strip.

This bimetallic strip will be housed between a hot source and a cold source and a piezoelectric material that is vibrated by deformation of the sensitive element, the piezoelectric material being arranged so that it is not inserted between the bimetallic strip and the hot source and the cold source.

In other words, the piezoelectric material is moved out of the space between the sensitive element and the hot and the cold zones such that the piezoelectric material does not reduce the effect of temperature on the deformation of the sensitive element, nor its deformation.

Very advantageously, the piezoelectric material is suspended directly from the sensitive element. It is thus vibrated every time the configuration changes when the sensitive element is heated or when the sensitive element is cooled. Thus, the quantity of converted thermal energy is increased.

Also very advantageously, the sensitive element is in contact with the hot or cold source in at least one of its configurations.

The present invention is then a system for converting thermal energy into electrical energy comprising at least one temperature sensitive element called the sensitive element, that can be placed in a space delimited by a hot source and a cold source facing each other, said sensitive element extending along a longitudinal axis, at least one suspended element integral in motion with the sensitive element and extending laterally from the sensitive element and comprising a free end, and at least one suspended piezoelectric element, said piezoelectric element being arranged relative to the suspended element such that it is vibrated when the sensitive element changes configuration, said piezoelectric element being designed to be located outside the space defined between the sensitive element and the hot source and outside the space between the sensitive element and the cold source.

According to one example embodiment, the piezoelectric element is suspended from a part fixed relative to the sensitive element and is vibrated by the suspended element.

The suspended element may extend on each side of the longitudinal axis of the sensitive element.

The sensitive element may be in contact with either the hot source or the cold source in at least one of its forms.

The suspended element may be made as a single-piece with the sensitive element.

Advantageously, the system may comprise a mass suspended from the piezoelectric element.

For example, the sensitive element is a bimetallic strip.

As a variant, the sensitive element may be an element made of shape memory alloy.

The system may comprise several suspended elements arranged adjacent to each other each extending laterally from the sensitive element.

For example, the conversion system forms an energy recovery device, the piezoelectric element being electrically connected to a means of storing the electricity generated. The system may form a vibration sensor.

Another subject-matter of the invention is an assembly for converting thermal energy into electrical energy comprising a hot source and a cold source facing each other and an energy conversion system according to this invention, said conversion system being arranged between the hot source and the cold source such that the piezoelectric element is designed to be located outside the space defined between the sensitive element and the hot source, and outside the space between the sensitive element and the cold source. For example, heat may be supplied to the hot source by an electronic system.

BRIEF DESCRIPTION OF THE DRAWINGS

This invention will be better understood after reading the following description and drawings in which.

DETAILED PRESENTATION OF PARTICULAR EMBODIMENTS

Figure 1A:
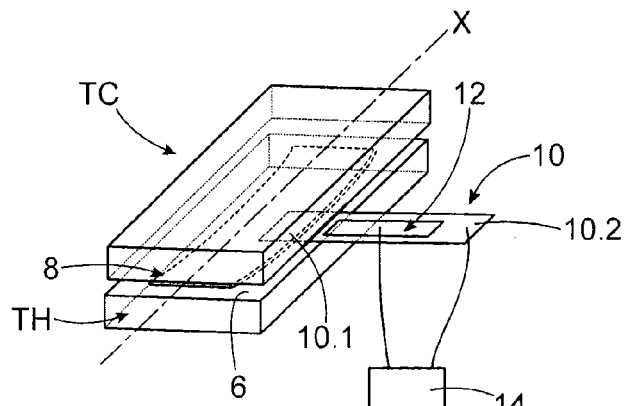
FIG. 1A is a perspective view of an example embodiment of a system shown diagrammatically and placed between a hot source and a cold source.
Figure 1B:
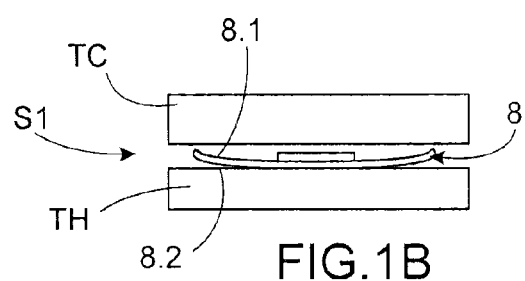
FIG. 1B is a side view of the system in FIG. 1A.

FIGS. 1A and 1B show an example embodiment of a system S1 sensitive to the temperature.

The system S1 comprises a hot source TH and a cold source TC located facing each other and delimiting a space 6 between them.

In the example shown, the sources are represented by plane surfaces, but other shapes such as concave or convex surfaces could be envisaged. The hot source may be formed by flexible heating cords or reservoirs closed by a membrane for which the volume varies with the temperature.

For the cold source, an air draft could be envisaged, and mechanical means could then be provided to direct this air current.

The system S1 comprises a temperature sensitive element 8 referred to in the following as a sensitive element, with a longitudinal axis X and an element 10 fixed to the sensitive element 8 and extending transverse to the longitudinal axis X. The element 10 will be referred to as the suspended element.

The sensitive element 8 is housed in the space 6. The sensitive element 8 is placed between the hot source TH and the cold source TC such that one of its faces 8.1 is facing the cold source TC and its opposite face 8.2 is facing the hot source.

In the example shown, the element 10 is in the shape of a plate fixed to the face of the sensitive element 8.1 through one longitudinal end 10.1, the other longitudinal end 10.2 being free.

The system also comprises an element made of a piezoelectric material 12 referred to in the following as the piezoelectric element, located on a face of the suspended element 10.

The piezoelectric element is electrically connected to a load 14, for example a battery or a consuming device, to recover the electricity generated by the device.

"Temperature sensitive element" in this application refers to an element with two shapes and that is capable of changing shape under the effect of a temperature variation.

The sensitive element 8 may consist of a bimetallic strip. As mentioned beforehand, a bimetallic strip is formed from two strips made of different metals or alloys with different coefficients of expansion, the two strips being fixed by welding or gluing so as to form a monolithic element. Thus, when one of the strips expands, the bimetallic strip will curve. When the bimetallic strip is heated, it changes from a first configuration to a second configuration, and this change is referred to as "blistering", and when it is cooled, it returns to its first configuration and this change is referred to as "unblistering".

The sensitive element 8 may also be formed from a shape memory alloy element that has memorised two shapes.

The following description contains examples of bimetallic strips and shape memory alloys.

Throughout the remainder of the description, the bimetallic strip will be referred to as the "sensitive element".

As shown diagrammatically in FIGS. 1 to 5, the bimetallic strip is curved: when it changes configuration, it changes from a curved state to an opposite curved state.

Preferably, the bimetallic strip is sized and installed in the space 6 such that in a first state, one of its faces 8.1, 8.2 is close to and preferably in contact with the hot source or cold source, and in a second state the other of the faces 8.2, 8.1 is close to and preferably in contact with the cold source or the hot source. Thus, the transfer between the hot and cold sources and the bimetallic strip is direct and their effect on the bimetallic strip is improved, the frequency of deformation of the bimetallic strip is thus optimised. The central zone of the bimetallic strip with the greatest curvature can come into contact with the sources.

Preferably, the bimetallic strip is sized such that when it changes configuration, the reduction of its deformation due to damping caused by shocks in contact with the sources is minimised to avoid reducing the amount of energy transmitted to the piezoelectric element.

We will now explain the operation of system S1.

We will assume that the bimetallic strip 8 is in contact with the hot source TH when it is in the rest state.

The bimetallic strip 8 is heated, the materials from which the strips are composed expand, one more than the other due to the different coefficients of expansion; beyond a certain expansion threshold, the curvature of the bimetallic strip is inverted and it comes into contact with the cold source. This change in configuration of the bimetallic strip causes vibration of the suspended element 10 and consequently the piezoelectric element. The piezoelectric element is polarised and generates an electrical voltage that will be retrieved by the load 14. Vibration is particularly vigorous if the configuration change is sudden. This corresponds to the value of the force output at the time of the deformation. For example, this force may be measured by a force sensor. The value of the force may have to exceed a threshold value depending on the application.

The bimetallic strip that is now in contact with the cold source cools and the two strips contract which causes a new inversion of the curvature. This new change in the configuration once again starts vibration of the suspended element 10 and the piezoelectric element that generates an electrical voltage.

This example is particularly advantageous because it enables starting vibration of the piezoelectric element every time that the configuration of the bimetallic strip changes, which optimises the quantity of electricity generated.

In the example shown and also advantageously, the suspended element is fixed to the central part of the bimetallic strip such that it experiences the largest possible displacement amplitude. Therefore its vibration is maximised.

The suspended element may be fixed to the bimetallic strip away from its central part.

Advantageously, it may be planned that the piezoelectric element is located at the free end of the suspended element.

Figure 2:
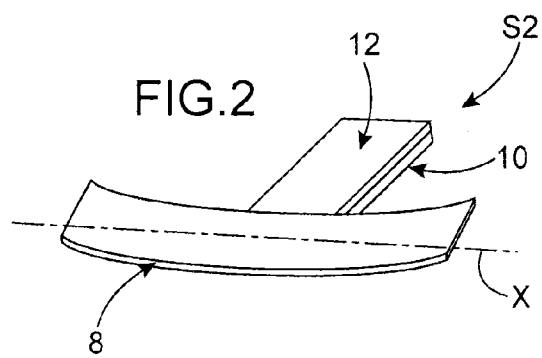
FIG. 2 is a perspective view of a variant embodiment of the system in FIG. 1A.

FIG. 2 shows a system S2 in which the piezoelectric element 12 entirely covers one face of the suspended element 10. Note that as the area of the piezoelectric element increases, the quantity of electricity that is potentially generated also increases. As a variant, the two faces of the suspended element may be covered by a piezoelectric element 12.

Figure 3:
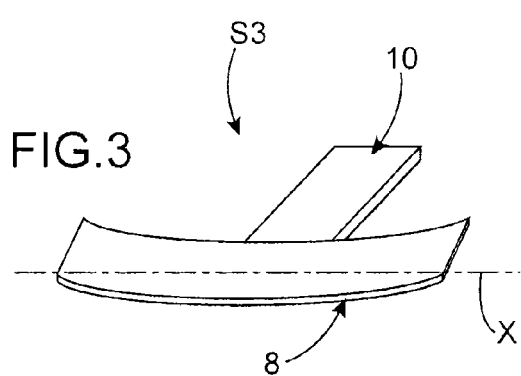
FIG. 3 is another variant embodiment of the system in FIG. 1A, FIGS. 4A and 4B are perspective views of an example embodiment of the system according to the invention.

FIG. 3 shows a system S3 in which the suspended element 10 is made directly from a piezoelectric material. The piezoelectric element has a larger volume, and in particular it is thicker than the element in FIG. 2, without increasing the dimensions or the mass of the system. This is particularly useful because the voltage response and the quantity of energy recovered depend on the thickness of the piezoelectric material.

For example the piezoelectric element may be fixed to the bimetallic strip by gluing.

FIGS. 4A, 4B, 5 and 6, show an example embodiment of a system according to the invention in which the piezoelectric element 12 is not directly supported by the suspended element 10. The hot and cold sources are not shown.

Figure 4A:
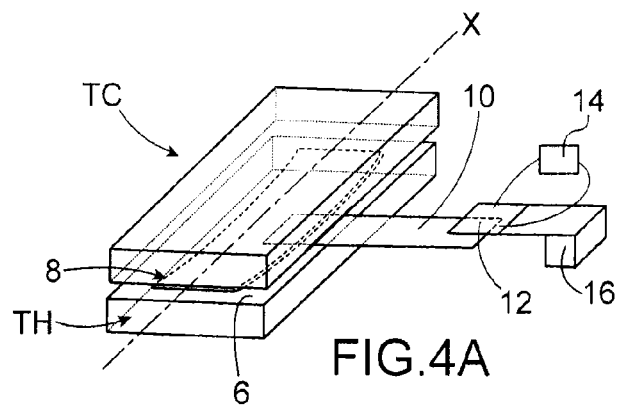
Figure 4B:
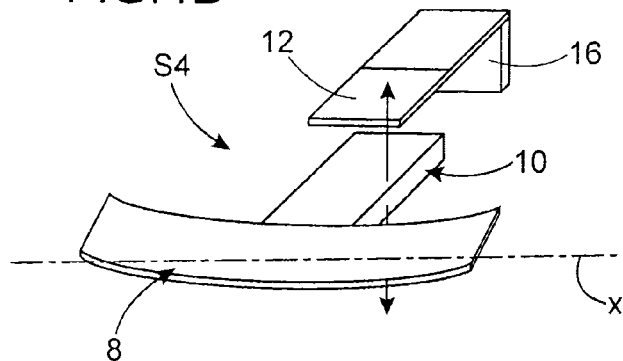

In FIGS. 4A and 4B, the system S4 comprises a piezoelectric element 12 suspended by a longitudinal end from a support 16 and is oriented such that its opposite longitudinal end is loaded in movement by the suspended element 10 when the bimetallic strip 8 changes from one of its configurations to the other of its configurations. The piezoelectric element 12 is located above or below the suspended element 10. The piezoelectric element 12 and the support 16 are located outside the space defined between the bimetallic strip 8 and the hot source TH and outside the space between the bimetallic strip 8 and the cold source TC. The piezoelectric element 8 is electrically connected to a load 14, for example a battery or a consuming device, to recover electricity generated by the device.

More generally, the system comprises a piezoelectric element fixed on a support and located on the trajectory of the bimetallic strip so that it is loaded by it during changes in the configuration of the bimetallic strip.

Operation of this system is similar to operation of the system shown in FIG. 1.

With this configuration, the piezoelectric element 12 does not interfere with the cold and hot zones. Since it is at a distance outside the space between the hot source and the cold source, there is no contact with these zones. Furthermore, the piezoelectric element does not participate in thermal equilibrium around the bimetallic strip. This has the effect of providing a better contact of the bimetallic strip with the cold and hot zones, which increases the vibration frequency.

Furthermore, the piezoelectric element experiences the shock of the suspended element 10 associated with the bimetallic strip, thus the energy due to the shock of the suspended element on the piezoelectric element is additional to the vibration energy. Therefore the quantity of recovered energy is increased.

This recovery device also allows more freedom in the choice of the material forming the piezoelectric element because heat transfer phenomena no longer have to be taken into account.

Furthermore, since the piezoelectric element is not fixed to the bimetallic strip, the curvature of the bimetallic strip can be adjusted so that its frequency can match the optimum frequency without interfering with the piezoelectric element(s).

Figure 5:
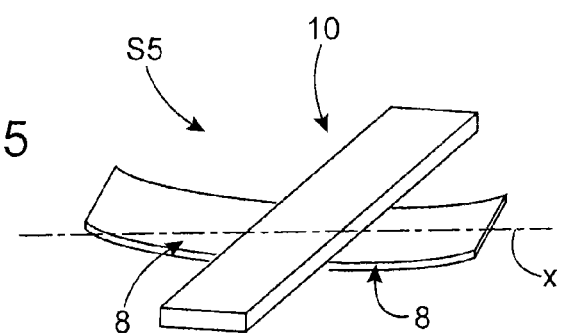
FIG. 5 is a perspective view of a variant embodiment of the system in FIGS. 4A and 4B.

FIG. 5 shows a variant S5 of the system S4 shown in FIG. 4, in which the suspended element 10 extends on each side of the longitudinal axis X of the bimetallic strip 8. The system comprises two piezoelectric elements suspended from a support symmetrically about the longitudinal axis, and that can be made to vibrate by the two free ends of the suspended element. The quantity of energy generated can then be twice as much as with the system in FIG. 4.

Figure 6:
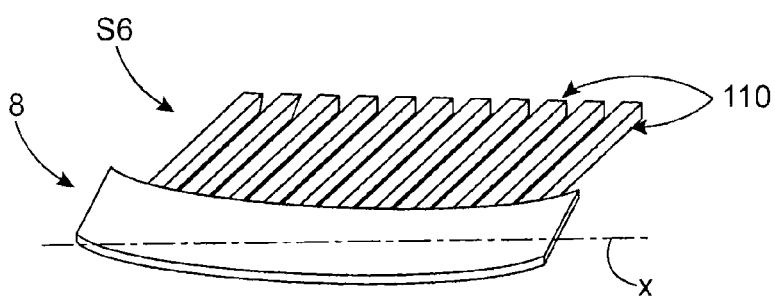
FIG. 6 is a perspective view of another variant embodiment of the system in FIGS. 4A and 4B.

FIG. 6 shows another variant embodiment in which the system S6 comprises a plurality of suspended elements 110 extending transversely along the bimetallic strip 8 and forming a comb. Each suspended element 110 is then designed to load one or several piezoelectric elements (not shown). The quantity of energy generated can then be increased. It would also be possible for a piezoelectric element to be loaded by several suspended elements.

This variant embodiment can be used to make a system in which the suspended elements react to different temperatures by choosing the dimensions and/or geometries of each. For example, a wider frequency range could be covered by adapting the piezoelectric elements to the suspended elements that apply loads to them.

It would also be advantageous to associate several systems in accordance with the embodiment in FIGS. 4 to 6, each being adapted to react at a given temperature. For example, all systems react at the same temperatures or they react at different temperatures, and in the latter case the systems function within an extended temperature range and can advantageously be used if the temperatures of the hot source and/or the cold source vary.

In another variant, several systems in FIGS. 4 to 6 can be associated mechanically such that blistering or deblistering of a bimetallic strip in one of the systems causes blistering of the bimetallic strip in the adjacent system by reaction.

These variant embodiments can improve performances.

A system similar to that in FIG. 5 can be made comprising a suspended element extending transverse to the bimetallic strip and on each side of it, and two piezoelectric elements fixed onto one of the faces of the element suspended on each side of the bimetallic strip. This system has an advantage over the system in FIG. 1A in that it generates twice as much electricity because it comprises two piezoelectric elements that are vibrated simultaneously.

The suspended element is not necessarily orthogonal to the longitudinal axis, and it would be possible to envisage that it forms an angle from it. It would also be possible that it does not extend in the plane of the sensitive element.

Advantageously, the suspended element(s) is (are) made in a single piece with the sensitive element which simplifies manufacturing and reduces energy losses to activate the piezoelectric element.

A mass may be provided at the free end of the piezoelectric element to facilitate its resonance.

As a variant, the suspended element and/or the piezoelectric element may have a variation in its shape, mass, thickness, topography, symmetry, so as to improve resonance of the piezoelectric element and thus increase the recovered energy.

It would also be possible to place several systems in the space delimited by the hot source and the cold source.

It would be possible to envisage making the surfaces of the hot and cold sources large enough so that the conversion system is entirely contained within the space delimited between the two sources. The system is configured such that there is no mechanical interaction between the piezoelectric element and/or the suspended element and the sources.

The system may have macroscopic dimensions, for example with areas of the order of several $cm^2$.

In this case, the bimetallic strip may for example be made of Fe—Ni alloys with different compositions, such as INVAR®. These alloys may also contain chromium and/or manganese that may be added, which increases their coefficient of expansion.

The piezoelectric element(s) may or may not be formed based on PZT (Lead Zirconate Titanate). Ferroelectric materials with perovskite structures may be used, for example lead titanate $PbTiO_3$, barium titanate $BaTiO_3$, potassium niobate $KNbO_3$, semiconductors in groups III-V with a wurtite type structure or synthetic polymers for example such as polyvinylidine difluoride (PVDF) $(-CH_2-CF_2)_n$ and its derivatives.

The dimensions of the system according to the invention may also be micrometric. The bimetallic strips may be made using a thin layer technology based on silicon and a metal, for example aluminium. Such bimetallic strips have been described in articles by W. Riethmueller, IEEE, Trans. Elec. Dev. ED-35, 1988 and H Jerman, J. Micromech. Microeng. 4, 1994. The thickness of each layer may then for example be of the order of about ten micrometers. Associations such as Si—Al, SiO2-Al, Si—Au, SiO2-Au e, Si—Pb . . . may be used.

The piezoelectric element(s) may be formed at microscopic scale with ZnO or AlN.

Sensitive elements made of shape memory alloys may for example be made from CuZn, CuZnAl, CuNiAl, AuCd, FePt. The choice and stoichiometry of the materials are made as a function of the working temperature range defined by the hot and cold sources.

For example, the area of the bimetallic strip may vary from a few mm² to several tens of cm² with a thickness from a few tens of μm to several hundred μm, and similarly for sensitive elements made of shape memory alloys. Preferably, the bimetallic strip is thin such that its volume is small and its temperature quickly becomes the same as the temperature of the hot source or the cold source, while maintaining a sufficient deformation amplitude so that this deformation can be transmitted to the piezoelectric element.

For example, such a system can generate a few tens of μW.

A bimetallic strip is chosen, and more particularly the materials used to make the strips are chosen, such that the two transition temperatures causing blistering and deblistering of the bimetallic strip are close so that the bimetallic strip will have a high frequency and thus the piezoelectric element can be made to vibrate at a high frequency.

Preferably, the bimetallic strip in each of its configurations is very close to one of the sources and preferably it is in direct contact with them so that its temperature quickly becomes equal to the temperature of the source with which it is in contact.

Thus, there is no loss of frequency of the bimetallic strip, since it is very efficiently brought to the temperature of one of the sources. Furthermore, the amplitude of the piezoelectric element is not less than the amplitude of a system in which for example the piezoelectric element is on the cold source.

As an example for a macroscopic system, the dimensions of the bimetallic strip may be 3.5 cm long, 2 cm wide and 140 μm thick, with transition temperatures of the bimetallic strip equal to 120° C. and 105° C. The piezoelectric element may be 5.4 cm long, 1.3 cm wide and 200 μm thick. The distance between the cold and hot sources is for example 700 μm.

With the invention, thermal energy is converted into electrical energy via a mechanical energy. The electrical energy may be used as an energy source to supply power to a load, thus forming an energy recovery system.

It may also be used to transfer additional information, for example the system may be used as a vibration sensor and it may be connected to an action such as an alarm, a test, etc.

It may also be interesting to choose a piezoelectric material with a thermal capacity capable of absorbing the heat from the bimetallic strip since it is contact with it. This may thus help with thermal regulation of the bimetallic strip and consequently optimise its operating frequency.

The invention claimed is:

1. A system for converting thermal energy into electrical energy, comprising:
   at least one temperature sensitive element configured to be placed in a space delimited by a hot source and a cold source facing each other, the sensitive element extending along a longitudinal axis;
   at least one suspended element integral in motion with the sensitive element and extending laterally from the sensitive element and including a free end; and
   at least one suspended piezoelectric element, the piezoelectric element being arranged relative to the suspended element such that it is vibrated when the sensitive element changes configuration, the piezoelectric element configured to be located entirely outside a space defined between the sensitive element and the hot source and entirely outside a space between the sensitive element and the cold source, when the piezoelectric element is suspended from a part fixed relative to the sensitive element and is vibrated by the suspended element.

2. A system according to claim 1, wherein the sensitive element is in contact with either the hot source or the cold source in at least one of its forms.

3. A system according to claim 1, wherein the suspended element is a single-piece with the sensitive element.

4. A system according to claim 1, wherein the suspended element extends on each side of the longitudinal axis of the sensitive element.

5. A system according to claim 1, further comprising a mass suspended from the piezoelectric element.

6. A system according to claim 5, wherein the sensitive element is a bimetallic strip.

7. A system according to claim 1, wherein the sensitive element is an element made from a shape memory alloy.

8. A system according to claim 1, comprising plural suspended elements arranged adjacent to each other each extending laterally from the sensitive element.

9. A system according to claim 1, forming an energy recovery device, the piezoelectric element being electrically connected to a means for storing electricity generated.

10. A system according to claim 1, forming a vibration sensor.

11. An assembly for converting thermal energy into electrical energy, comprising:
    a hot source and a cold source facing each other; and
    an energy conversion system according to claim 1, the conversion system arranged between the hot source and the cold source such that the piezoelectric element is configured to be located entirely outside a space defined between the sensitive element and the hot source and entirely outside a space between the sensitive element and the cold source.

12. A conversion assembly according to claim 11, wherein heat is supplied to the hot source by an electronic system.

* * * * *